US012183722B2

(12) United States Patent
Ong et al.

(10) Patent No.: US 12,183,722 B2
(45) Date of Patent: Dec. 31, 2024

(54) MOLDED INTERCONNECTS IN BRIDGES FOR INTEGRATED-CIRCUIT PACKAGES

(71) Applicant: Intel Corporation, Santa Clara, CA (US)

(72) Inventors: Jenny Shio Yin Ong, Bayan Lepas (MY); Seok Ling Lim, Kulim (MY); Bok Eng Cheah, Bukit Gambir (MY); Jackson Chung Peng Kong, Tanjung Tokong (MY)

(73) Assignee: Intel Corporation, Santa Clara, CA (US)

( * ) Notice: Subject to any disclaimer, the term of this patent is extended or adjusted under 35 U.S.C. 154(b) by 423 days.

(21) Appl. No.: 17/638,039

(22) PCT Filed: Jun. 26, 2020

(86) PCT No.: PCT/US2020/039907
§ 371 (c)(1),
(2) Date: Feb. 24, 2022

(87) PCT Pub. No.: WO2021/061246
PCT Pub. Date: Apr. 1, 2021

(65) Prior Publication Data
US 2022/0278084 A1 Sep. 1, 2022

(30) Foreign Application Priority Data
Sep. 25, 2019 (MY) .............................. 2019005590

(51) Int. Cl.
H01L 25/16 (2023.01)
H01L 23/538 (2006.01)
(Continued)

(52) U.S. Cl.
CPC .......... *H01L 25/16* (2013.01); *H01L 23/5381* (2013.01); *H01L 23/5383* (2013.01);
(Continued)

(58) Field of Classification Search
CPC ............. H01L 23/5381; H01L 23/5385; H01L 23/5386; H01L 25/0652; H01L 25/071; H01L 25/112
See application file for complete search history.

(56) References Cited

U.S. PATENT DOCUMENTS

2007/0045815 A1 3/2007 Urashima et al.
2017/0287838 A1 10/2017 Pietambaram et al.
(Continued)

FOREIGN PATENT DOCUMENTS

EP 3051585 A1 8/2016
JP 2016046517 A 4/2016
(Continued)

OTHER PUBLICATIONS

"International Application Serial No. PCT/US2020/039907, International Search Report mailed Oct. 12, 2020", 3 pgs.
(Continued)

Primary Examiner — David A Zarneke
(74) Attorney, Agent, or Firm — Alliance IP, LLC

(57) ABSTRACT

Disclosed embodiments include molded interconnect bridges that are in a molded frame, where the molded frame includes passive devices that couple to a metal buildup layer that includes at least one power rail and one ground rail. The molded interconnects bridge is embedded in an integrated-circuit package substrate between a die side and a land side, and closer to the die side.

23 Claims, 5 Drawing Sheets

(51) Int. Cl.
   *H01L 25/00*     (2006.01)
   *H01L 25/065*    (2023.01)
   *H01L 25/07*     (2006.01)
   *H01L 25/11*     (2006.01)
   *H01L 49/02*     (2006.01)

(52) U.S. Cl.
   CPC ...... *H01L 23/5385* (2013.01); *H01L 23/5386* (2013.01); *H01L 25/0652* (2013.01); *H01L 25/071* (2013.01); *H01L 25/112* (2013.01); *H01L 25/50* (2013.01); *H01L 28/40* (2013.01)

(56) References Cited

U.S. PATENT DOCUMENTS

2018/0175001 A1   6/2018   Pyo et al.
2018/0366456 A1   12/2018  Jeong et al.
2019/0229076 A1   7/2019   Kim et al.

FOREIGN PATENT DOCUMENTS

WO   WO-2016191195 A1   12/2016
WO   2017111790 A1      6/2017
WO   2018004692 A1      1/2018
WO   WO-2021061246 A1   4/2021

OTHER PUBLICATIONS

"International Application Serial No. PCT/US2020/039907, Written Opinion mailed Oct. 12, 2020", 5 pgs.

EPO; Extended European Search Report issued in EP Patent Application No. 20869146.9, dated Aug. 23, 2023; 9 pages.

"International Application Serial No. PCT US2020 039907, International Preliminary Report on Patentability mailed Apr. 7, 2022", 7 pgs.

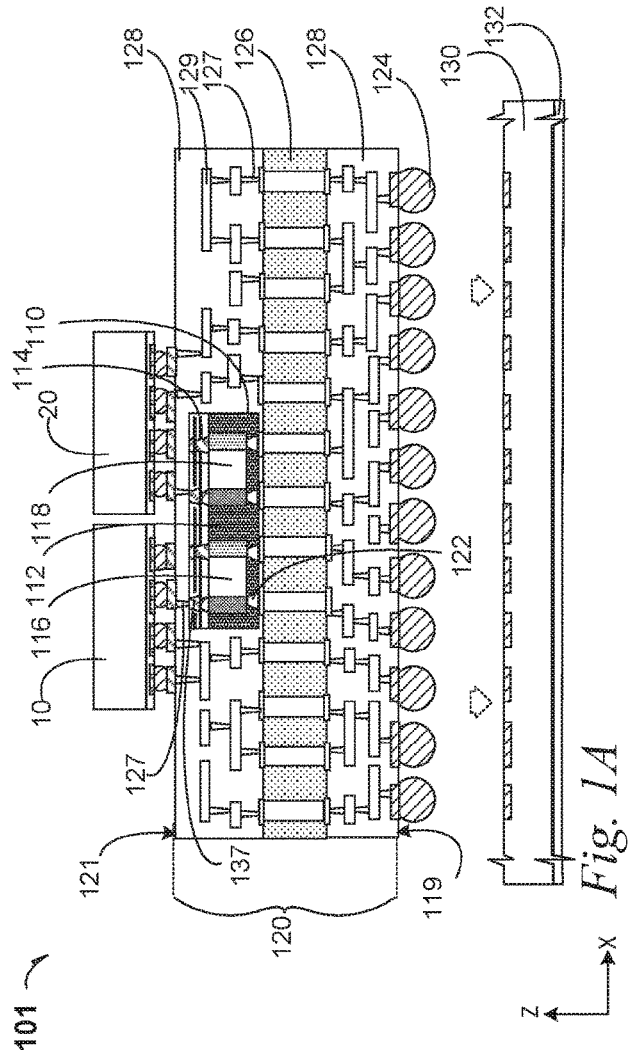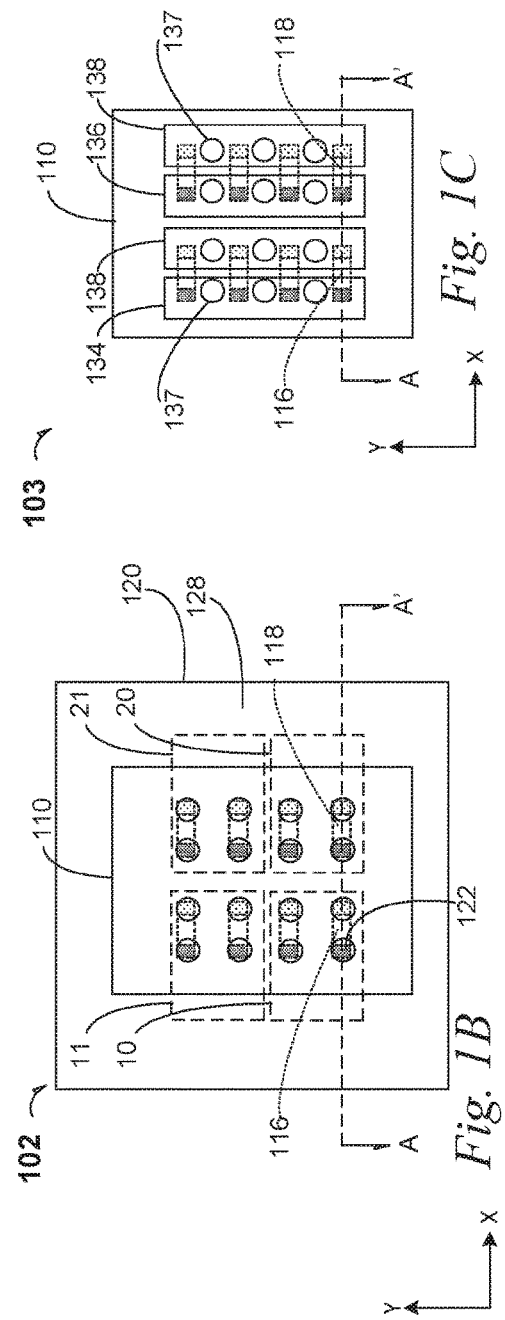

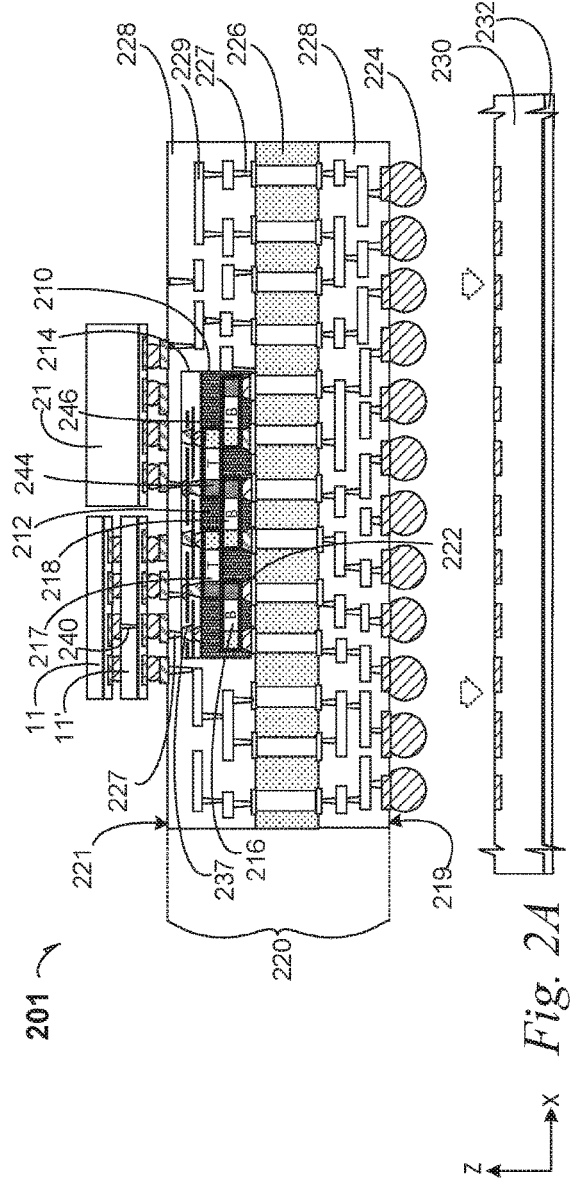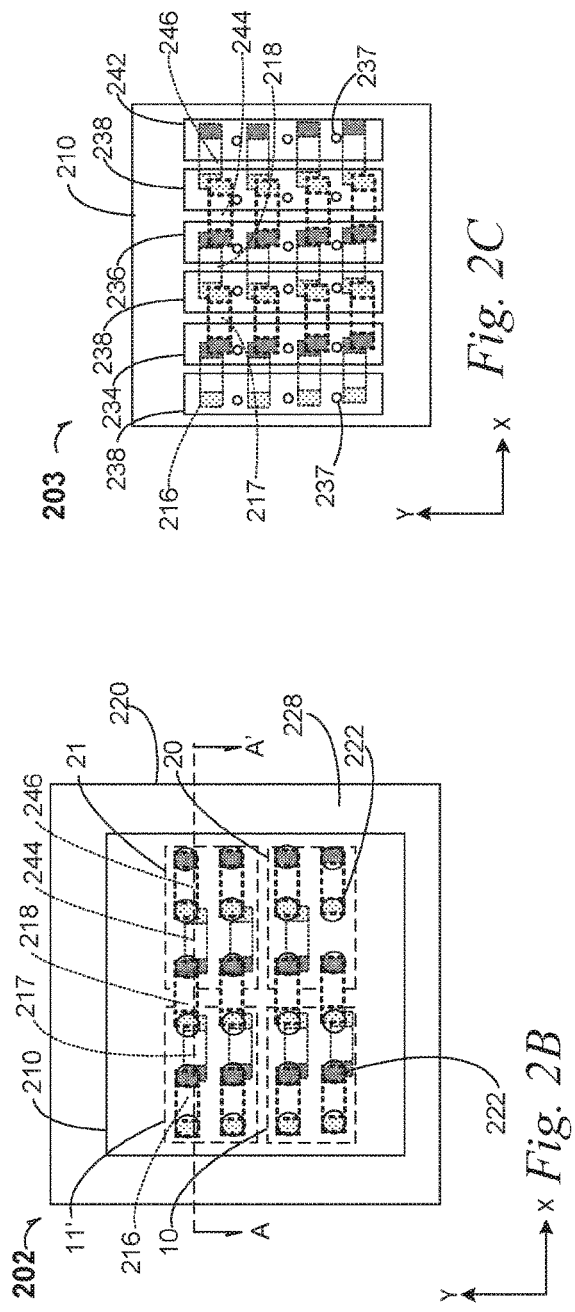

MOLDED INTERCONNECTS IN BRIDGES FOR INTEGRATED-CIRCUIT PACKAGES

PRIORITY APPLICATION

This application is a U.S. National Stage Application under 35 U.S.C. 371 from International Application No. PCT/US2020/039907, filed Jun. 26, 2020, published as WO 2021/061246, which claims the benefit of priority to Malaysian Application Serial Number PI 2019005590, filed Sep. 25, 2019, all of which are incorporated herein by reference in their entirety.

FIELD

This disclosure relates to power delivery for integrated-circuit device packages.

BACKGROUND

Integration of multiple integrated-circuit chips within a package, for example multi-chip package (MCP) integrated-circuit device with high interconnect density between chips has power-delivery issues such as undesired inductance loops and impedance peak profiles.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1A is a cross-section elevation of an integrated-circuit package with a molded interconnects bridge as part of an integrated-circuit package apparatus according to an embodiment;

FIG. 1B is a bottom plan of portions of the integrated-circuit package depicted in FIG. 1A according to an embodiment;

FIG. 1C is a top view of the molded interconnects bridge depicted in FIG. 1A according to an embodiment;

FIG. 2A is a cross-section elevation of an integrated-circuit package apparatus with a molded interconnects bridge that accommodates stacked and staggered passive devices according to several embodiments;

FIG. 2B is a bottom plan of portions of the integrated-circuit package apparatus depicted in FIG. 2A according to an embodiment;

FIG. 2C is a top view of the molded interconnects bridge depicted in FIG. 2A according to an embodiment;

DETAILED DESCRIPTION

Figure 3:
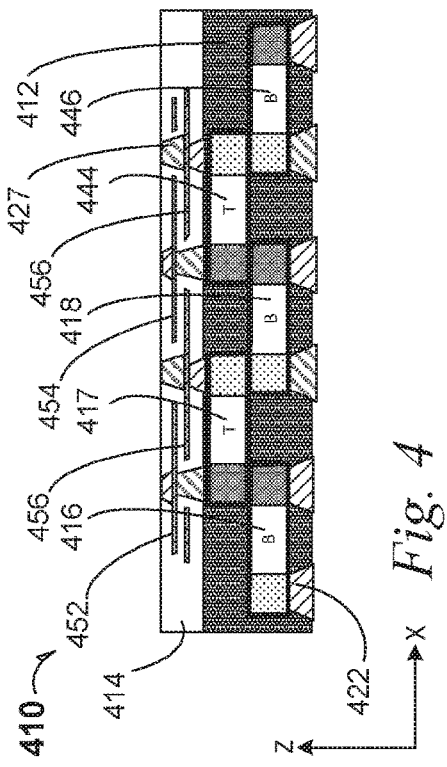
FIG. 3 is a cross-section elevation detail of a molded interconnects bridge according to an embodiment.

Disclosed embodiments include molded interconnects bridges (MIBs) that are embedded in the die side of integrated circuit (IC) package substrates and integrated-circuit (IC) dice on the die side. Power-delivery networks (PDNs) are facilitated where passive devices such as decoupling capacitors are embedded in the MIBs such that power delivery demand changes are faster by the proximate location of the passive devices within the die side of the IC package substrate. In an embodiment, the capacitor is a multi-layer ceramic capacitor. In an embodiment, the capacitor is a silicon capacitor.

Ball-grid array densities are facilitated for input-output (I/O) density changes where keep-out-zone issues are addressed. Location of the passive devices, closer to the integrated-circuit dice, relieves integrated-circuit package substrate real estate issues to increase interconnect densities.

Power integrity of electrical performance is achieved by reduced package inductance looping. Decoupling capacitors are directly coupled to power rails (Vcc) and to ground (Vss), which lowers power delivery network impedance ($Z_{PDN}$) and jitter behaviors.

FIG. 1A is a cross-section elevation of an integrated-circuit package 101 with a molded interconnects bridge that is part of an integrated-circuit package apparatus according to an embodiment. A molded interconnects bridge (MIB) 110 in a molding-mass frame 112 includes a metal build-up layer 114 and at least two passive devices 116 and 118 according to an embodiment. The molding-mass frame 112 is embedded in an integrated-circuit package substrate 120, nearer to a die side 121 than to a land side 119.

The passive devices 116 and 118, occupy at least some of the same vertical space encompassed by the molding-mass frame 112. The metal build-up layer 114 may also be referred to as a redistribution layer (RDL) 114 near the die side 121, where power (Vcc) rails and ground (Vss) rails can aggregate more than one passive device, such as a plurality of decoupling capacitors. In an embodiment, the metal build-up layer 114 includes conductive traces for die 10 to die 20 intercommunications, where the conductive trace width is in a range from 1 micrometer (μm) to 5 μm, and spacing between traces in the X-Y plane is in a range from 1 μm to 5 μm.

In an embodiment, the passive devices 116 and 118 are each coupled to the die side 121 and to the land side 119 by vias and traces. In the direction of the land side 119, the passive device 116 is coupled by an electrical interconnect 122 to an electrical bump in an array, one electrical bump of which is indicated by reference number 124.

In an embodiment, the IC package substrate 120 includes a core layer 126 for rigidity. Above and below the core layer 126, build-up layers 128 include organic layers that accommodate interconnects such as package vias 127 and traces 129 to facilitate interconnection of integrated-circuit (IC) dice 10 and 20 with the molded interconnect bridge 110, as well as pin-out connections on the land side 119 to the electrical bump array 124. In an embodiment, the organic layers 128 are fabricated from composites of epoxy polymer resins and silica particulate materials. In an embodiment width of the traces 129 is in a range from 5 μm to 40 μm. In an embodiment, the IC package substrate 120 may exclude core layer 126 for package z-height (or thickness) reduction.

In an embodiment, the passive device 116 is a first capacitor 116 and a subsequent passive device 118 is a subsequent capacitor 118 in the molding-mass frame 112, such that the two capacitors devices 116 and 118 are separately coupled to different potential power rails, such as a 1.0 Volt power rail for the first capacitor and a 1.5 V power rail for the subsequent capacitor 118. In an embodiment, the capacitors have a thickness in a range from 20 μm to 300 μm.

In an embodiment, a first integrated-circuit die 10 is on the die side 121 of the IC package substrate 120, and a subsequent integrated-circuit die 20 is also on the on the die side 121, where two IC dice 10 and 20 are side-by-side. In an embodiment, the first IC die is a central processing unit such as a processor made by Intel Corporation of Santa Clara, California In an embodiment, the subsequent IC die 20 is a graphics processor 20. In an embodiment, the first IC die 10 is bumped onto the die side 121 with a bump array with a bump-pitch geometry in a range from 20 micrometer (µm) to 150 µm.

In an embodiment, the land side 119 faces a board 130 such as a motherboard, or a printed wiring board, in a computing system, and the electrical hump array 124 is seen being brought toward the board 130. In an embodiment, the board 130 has an external shell 132 that provides at least one of physical and electrical insulative protection for components on the hoard 130. For example, the external shell 132 is an integral portion of the board 130, that is part of a hand-held computing system such as a communication device. In an embodiment, the external shell 132 is an integral portion of the board 130, that is part of the exterior of a mobile computing platform such as a drone.

FIG. 1B is a bottom plan of portions of the integrated-circuit package 101 depicted in FIG. 1A according to an embodiment. The integrated-circuit package apparatus 102 is "peeled" just above the core layer 126 (see FIG. 1A) to reveal the MIB 110 and the first and subsequent passive devices 116 and 118, respectively. The first and subsequent passive devices 116 and 118 are depicted in ghosted lines as several electrical interconnects 122 are depicted emerging from the build-up layers 128 that are above (see FIG. 1A) the core layer 126. FIG. 1B also shows the first and subsequent IC dice 10 and 20 in ghosted lines as they are deployed also above the build-up layers 128 that are above the core layer 126.

In an embodiment, die-side chips include the first and subsequent IC dice 10 and 20 as respective logic and graphics processors, and a third and fourth IC dice 11 and 21. In an embodiment, the third IC die is a memory die 11, such as a memory-die stack of non-volatile memory devices that are coupled by a through-silicon via (TSV). (For example, the IC dice 11 and 11' depicted in FIG. 2A illustrates a memory-die stack that is coupled by a TSV 240). In an embodiment, the fourth IC die 21 is a baseband processor die 21. In an embodiment, the fourth IC die is a platform controller huh (PCH) die 21. In an embodiment, at least two IC dice on the die side are part of a disaggregated processor.

The passive devices 116 and 118 are seen along a section line A-A', and the passive devices 116 and 118 are depicted in ghosted lines where they are within the upper build-up layers 128. Two columns of the passive devices in four rows are illustrated by way of non-limiting example embodiment.

FIG. 1C is a top view of the molded interconnects bridge 110 depicted in FIG. 1A according to an embodiment. Viewing from the direction of the die side 121, details of a portion of the metal build-up layer 114 include power rails 134 and 136 and ground rails 138 according to an embodiment. The first and subsequent capacitors 116 and 118 are again depicted in ghosted lines are they are deployed below the respective power rails 134 and 136 and the ground rails 138. In an embodiment, the power rail 134 is configured for a potential of 1.0 V and the power rail 136 is configured for a potential of 1.5 V. In an embodiment, the power rails 134 and 136 and the ground rails 138 are coupled to the first and subsequent dice 10 and 20 through vertical vias 137 and package vias 127 (refer to FIG. 1A). In an embodiment, the conductive traces interconnect the first and subsequent IC dice 10 and 20 reside adjacent the power rails 134, 136 and ground rails 138 within the metal build-up layer 114.

FIG. 2A is a cross-section elevation of an integrated-circuit package 201 with a molded interconnects bridge that is part of an integrated-circuit package apparatus, and that accommodates stacked and staggered passive devices according to several embodiments. A molded interconnects bridge 210 is in a molding-mass frame 212 includes a metal build-up layer 214 and at least three passive devices 216, 217 and 218 according to an embodiment. The molding-mass frame 210 is embedded in an integrated-circuit package substrate 220, nearer to a die side 221 than to a land side 219.

The passive devices 216, 217 and 218, occupy at least some of the same vertical space encompassed by the molding-mass frame 212. The metal build-up layer 214 may also be referred to as a redistribution layer (RDL) 214 near the die side 221, where power (Vcc) rails and ground (Vss) rails can aggregate more than one stacked and staggered passive device, such as a plurality of decoupling capacitors. In an embodiment, the metal build-up layer 214 includes conductive traces for IC dice 11' and 21 intercommunications, where the conductive trace width is in a range from 1 micrometer (µm) to 5 µm, and spacing between traces in the X-Y plane is in a range from 1 µm to 5 µm.

In an embodiment, the stacked and staggered passive devices 216, 217 and 218 are each coupled to the die side 221 and to the package side 219. In the direction of the land side 219, the passive device 216 is coupled by an electrical interconnect 222 to an electrical bump in an array, one electrical bump of which is indicated by reference number 224.

In an embodiment, the IC package substrate 220 includes a core layer 226 for rigidity. Above and below the core layer 226, build-up layers 228 include organic layers that accommodate interconnects such as package vias 227 and traces 229 to facilitate interconnection of IC dice 11, 11' and 21 with the molded interconnect bridge 210, as well as pin-out connections on the land side 219 to the electrical bump array 224. In an embodiment, the IC package substrate 220 may exclude core layer 226 for package z-height (or thickness) reduction.

In an embodiment, the passive device 216 is a first capacitor 216, the passive device 217 is a stacked subsequent passive device 217 that is a subsequent capacitor 217 also in the molding-mass frame 212, and the passive device 218 is a third capacitor 218, such that the first and stacked subsequent capacitors devices 216 and 217 are coupled at Vcc terminals (darker shading) as a power rail. Further, the third capacitor 218 and the subsequent stacked capacitor 217 are coupled at Vss terminals (lighter shading) as a ground rail. In an embodiment, the capacitors 216 and 217, and 218 and 244 are separately coupled to different potential power rails, such as a 1.0 Volt power rail for the first and stacked subsequent capacitors 216 and 217, and a 1.5 V power rail for the third capacitor 218 and a fourth capacitor 244. In an embodiment, a fifth capacitor 246 and the fourth capacitor 244 are coupled at Vss terminals (lighter shading) as a ground rail. In an embodiment, the Vcc terminal of the fifth capacitor 246 is coupled to a different potential power rail, such as a 0.5 V power rail reside within the package substrate 220 through the electrical interconnect 222.

In an embodiment, a first integrated-circuit die 11 is above the die side 221 of the IC package substrate 220 and it is part of a memory-die stack including a bottom memory die 11'.

Communication between the two memory dice 11 and 11' is by a TSV 240 in the bottom memory die 11. Further, a subsequent integrated-circuit die 21 is also on the die side 221, where the IC dice 11, 11' and the IC die 21 are side-by-side.

In an embodiment, the land side 219 faces a board 230 such as a motherboard or a printed wiring board in a computing system, and the electrical bump array 224 is seen being brought toward the board 230. In an embodiment, the board 230 has an external shell 232 that provides at least one of physical and electrical insulative protection for components on the board 230. For example, the external shell 232 is an integral portion of the board 230, that is part of a hand-held computing system such as a communication device. In an embodiment, the external shell 232 is an integral portion of the hoard 230, that is part of the exterior of a mobile computing platform such as a drone.

FIG. 2B is a bottom plan of portions of the integrated-circuit package 201 depicted in FIG. 2A according to an embodiment. The integrated-circuit package apparatus 202 is "peeled" just above the core layer 226 to reveal the MIB 210 and the first, stacked subsequent and third passive devices 216, 217 and 218, respectively. The first and stacked subsequent passive devices 216 and 217, and the third passive device 218 are depicted in ghosted lines with the first and third devices 216 and 218 in heavier lines than the stacked subsequent 217, as they are closer to the viewer. Several electrical interconnects 222 are depicted emerging from the build-up layers 228 that are above (see FIG. 2A) the core layer 226. FIG. 2B also shows the first IC memory die 11, the stacked IC memory die 11' and the subsequent IC die 21 in ghosted lines as they are deployed also above the upper build-up layers 228.

In an embodiment, die-side devices include the IC dice 10 and 20 as respective logic and graphics processors, the first and first stacked IC dice 11 and 11' as memory dice, and a fourth IC 21 as a platform-controller hub (PCH) die 21. In an embodiment, die-side chips include the IC dice 10 and 20 as respective logic and graphics processors, the IC die 11' is a memory-controller hub (MCH) 11', the IC die 11 is one of several dice in a memory-die stack that uses TSVs, and the IC die 21 is a baseband processor die 21. In an embodiment, the IC dice 10 and 20 are part of a disaggregated processor.

The passive devices 216, 217 and 218 are seen along a section line A-A', and the passive devices 216, 217 and 218 are depicted in ghosted lines where they are within the upper build-up layers 228. A string of five passive devices (216, 217, 218, 244 and 246) runs in the X-direction, and four rows are illustrated by way of non-limiting example embodiment.

FIG. 2C is a top view of the molded interconnects bridge 210 depicted in FIG. 2A according to an embodiment. Viewing from the direction of the die side 221, details are depicted of the metal build-up layer 214 include power rails 234, 236 and 242 and ground rails 238 according to an embodiment. The first and stacked subsequent capacitors 216 and 217, and the third capacitor 218 are again depicted in ghosted lines are they are deployed below the respective power rails 234, 236 and 242, and the ground rails 238. In an embodiment, the power rail 234 is configured for a potential of 1.0 V, the power rail 236 is configured for a potential of 0.8 V and the power rail 242 is configured for a potential of 1.2 V. In an embodiment, the power rails 234, 236 and 242 and the ground rails 238 are coupled to the die-side devices (e.g., the IC dice 10 and 20, the first IC memory die 11' or the subsequent IC die 21) through vertical vias 237 and package vias 227 (refer to FIG. 2A). In an embodiment, the conductive traces interconnect the first IC memory die 11' and the subsequent IC die 21 reside adjacent the power rails 234, 236 and 242 and the ground rails 238 within the metal build-up layer 214.

FIG. 3 is a cross-section elevation detail of a molded interconnects bridge 310 according to an embodiment. The MIB 310 includes a molding-mass frame 312 includes a metal build-up layer 314 and at least two passive devices 316 and 318 according to an embodiment. The molding-mass frame 312 may also contain electrical interconnects 322 that are formed by opening interconnect corridors to the electrodes of the two passive devices 316 and 318.

The passive devices 316 and 318, occupy at least some of the same vertical space encompassed by the molding-mass frame 312. The metal build-up layer 314 may also be referred to as a redistribution layer (RDL) 314, where power (Vcc) rails 352 and 354, and ground (Vss) rails 356, which can aggregate more than one passive device, such as a plurality of decoupling capacitors. In an embodiment, the first and subsequent capacitors 316 and 318 are deployed below the respective power rails 352 and 354 and the ground rails 356. In an embodiment, the power rail 354 is configured for a potential of 1.0 V and the power rail 356 is configured for a potential of 1.5 V. In an embodiment, the power rails 352 and 354 and the ground rails 356 are coupled to a die side of a package substrate (e.g., die side 121 of package substrate 120 in FIG. 1A) through vertical vias 327.

Figure 4:
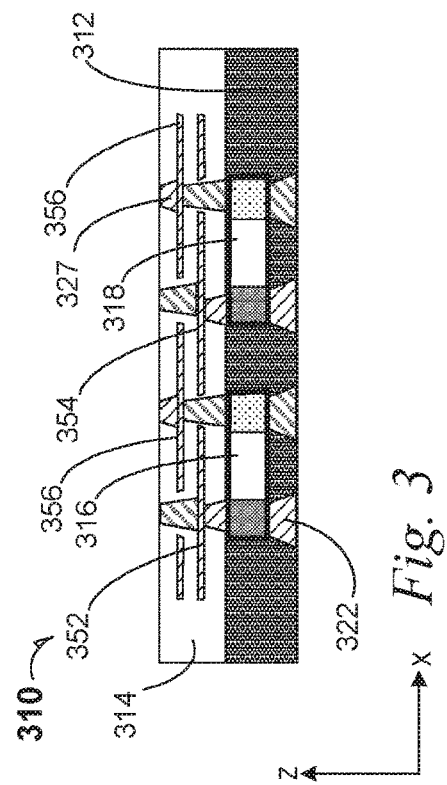
FIG. 4 is a cross-section elevation detail of a molded interconnects bridge according to an embodiment.

FIG. 4 is a cross-section elevation detail of a molded interconnects bridge 410 according to an embodiment. The MIB 410 includes a molding-mass frame 412 includes a metal build-up layer 414 and at least five passive devices 416, 417, 418, 444 and 446 according to an embodiment. The molding-mass frame 412 may also contain electrical interconnects 422 that are formed by opening interconnect corridors to the electrodes of the three passive devices 416, 418 and 446.

The several passive devices occupy at least some of the same vertical space encompassed by the molding-mass frame 412. The metal build-up layer 414 may also be referred to as a redistribution layer (RDL) 414, where power (Vcc) rails 452 and 454, and ground (Vss) rails 456, which can aggregate more than one passive device, such as a plurality of decoupling capacitors. In an embodiment, the several capacitors are deployed below the respective power rails 452 and 454 and the ground rails 456. In an embodiment, the power rail 452 is configured for a potential of 1.0 V, the power rail 456 is configured for a potential of 0.8 V and a power rail reside within a package substrate (not pictured) is configured for a potential of 1.2 V to couple to the fifth passive device 446. In an embodiment, the power rails 452 and 454 and the ground rails 456 are coupled to a die side of a package substrate (e.g., die side 221 of package substrate 220 in FIG. 2A) through vertical vias 427.

Figure 5:
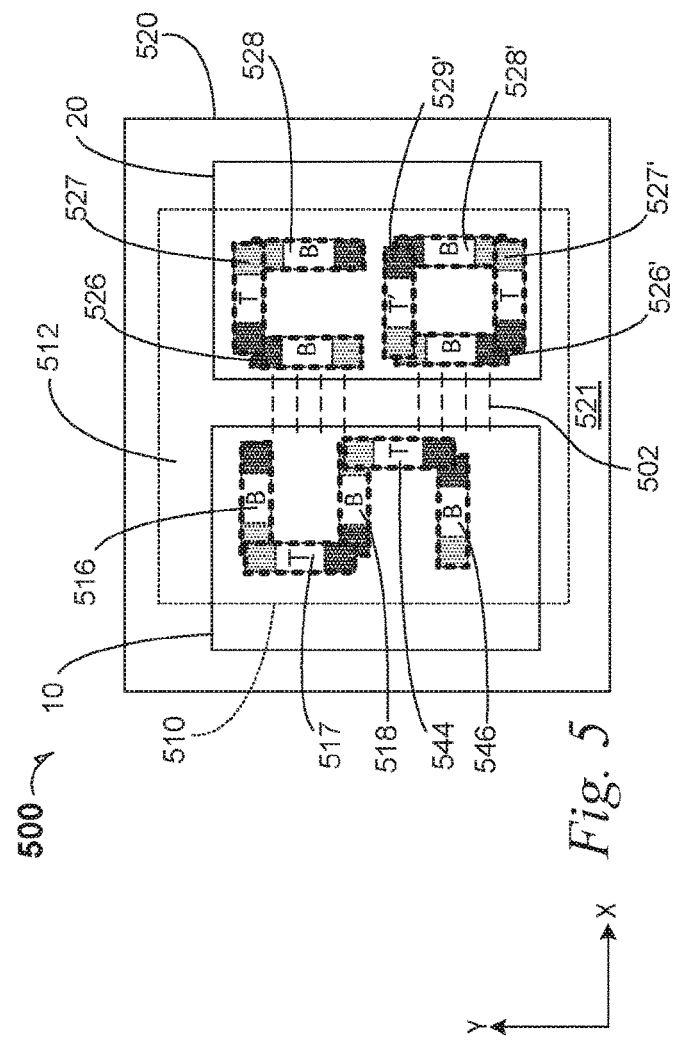
FIG. 5 is a top plan of an integrated circuit device package that includes a molded interconnects bridge according to an embodiment.

FIG. 5 is a top plan of an integrated circuit device package 500 that includes a molded interconnects bridge 510 that is embedded in an integrated-circuit package according to an embodiment. In an embodiment, IC dice 10 and 20 are interconnected through conductive traces 502 disposed within a metal build-up layer. Interconnections between several capacitors below at least two IC dice 10 and 20, are densified by different configurations within the metal build-up layer (such as the build-up layers 114, 241, 314 and 414 in respective FIGS. 1A, 2A, 3 and 4). The MIB 510 is assembled in a molding-mass frame 512 includes a metal build-up layer (which occupies the same X-Y footprint as the MIB 510) and several passive devices in various interconnected configurations according to an embodiment. The molding-mass frame 512 is embedded in an integrated-circuit package substrate 520, nearer to a die side 521 than to a land side.

A first group of passive devices 516, 517, 518, 544 and 546 occupy an X-Y space below a first IC die 10, and at least some of the same vertical (Z) space encompassed by the molding-mass frame 512.

Whereas the stacking fashion is in a semi-serpentine, five-capacitor arrangement, the several configurations have different voltages for power rails according to an embodiment. For example, the two power rails are formed, first by the top capacitor 517 and bottom capacitor 518 where power electrodes are stacked and in contact, and second by the top capacitor 544 and bottom capacitor 546 were power electrodes are stacked and in contact. In an embodiment, the power rail formed by the power electrodes of capacitors 517 and 518, have a voltage of 1V. The power rail formed by the capacitors 544 and 546 have a voltage of 1.5 V. And the bottom capacitor 516 has a voltage of 1.8 V.

Beneath the subsequent IC die 20, power rails are formed as well as ground rails by contacting appropriate power terminals to power terminals, and ground terminals to ground terminals. Whereas the stacking fashion is in semi-circular, three-capacitor arrangements, the several configurations have different voltages for power rails according to an embodiment. For example in an embodiment, capacitors 526, 527 and 528 that are seen on the upper right and beneath the subsequent IC die 20, form a power rail at the power electrodes of 526 and 527 and have a voltage of 1.0V. And the bottom capacitor 528 has a voltage of 1.8 V. The third power rail is depicted with the capacitors 526' and 527' that are seen on the lower right and beneath the subsequent IC die 20, form a power rail at the power electrodes of 526' and 527' and have a voltage of 1.5 V. And the fourth power rail is depicted with the capacitors 528' and 529', where the power electrodes are stacked, and have a voltage of 1.8V. Improved real-estate utilization and proximate location of the passive devices can be achieved through both semi-circular and circular (or closed loop) stacked capacitor arrangements.

FIGS. 6A through 6D represent fabrication of a molded interconnects bridge for assembly to at least two IC dice and for assembly into a package substrate according to several embodiments. Although some embodiments, depict only two passive devices, fabrication techniques disclosed are useful for stacked passive, stacked semi-serpentine passive, stacked semi-circular passives and stacked circular passives.

Figure 6A:
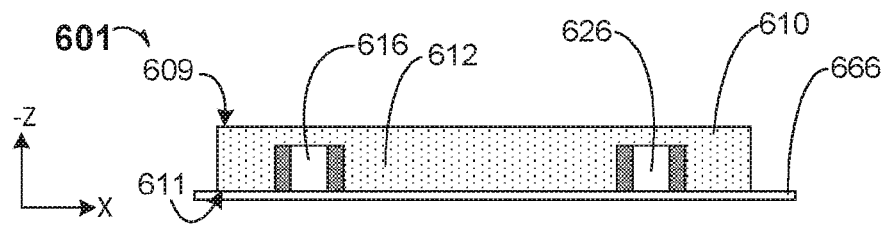
FIGS. 6A through 6D represent fabrication of a molded interconnects bridge for assembly to at least two integrated circuit dice, and assembly into to a package substrate according to several embodiments.
Figure 6B:
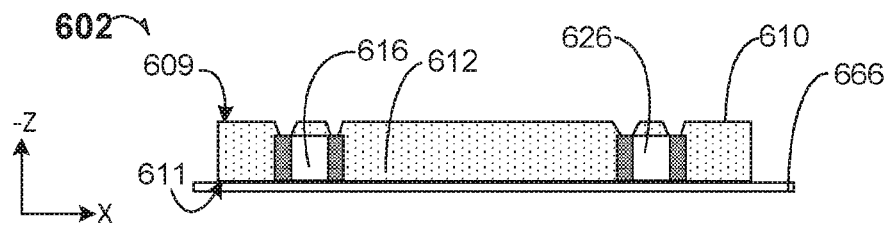
Figure 6C:
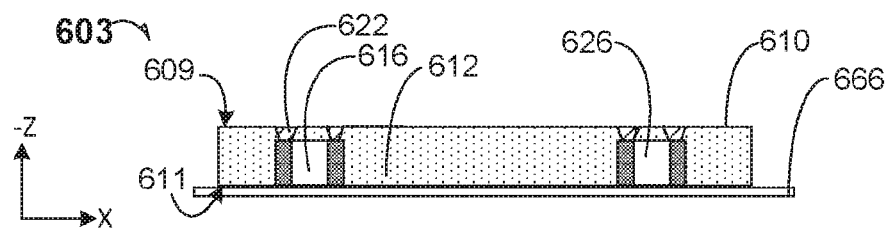

At FIG. 6A, a cross-section elevation of a molded interconnects bridge 610 is depicted during assembly 601 according to an embodiment. A first carrier 666 supports a first passive device 616 and a subsequent passive device 626, and a molded interconnects bridge 610 with a molding-mass frame 612 that encloses the passive devices 616 and 626. The assembly of passive devices 616 and 626 are over molded by a molding mass material 612 such that a die side 611 and a package side 609 are formed for later assembly into an IC package substrate. In an embodiment, a temporary bonding layer is disposed on the first carrier 666 to secure the first and subsequent passive devices 616, 626, and the molding-mass frame 612.

At 6B, the assembly 602 has been laser etched to expose capacitor electrodes by forming interconnect corridors.

At 6C, interconnect corridors are filled with interconnects 622, such as by metal deposition, by either electroless or electrolytic deposition, such as an electronics-grade copper material.

Figure 6D:
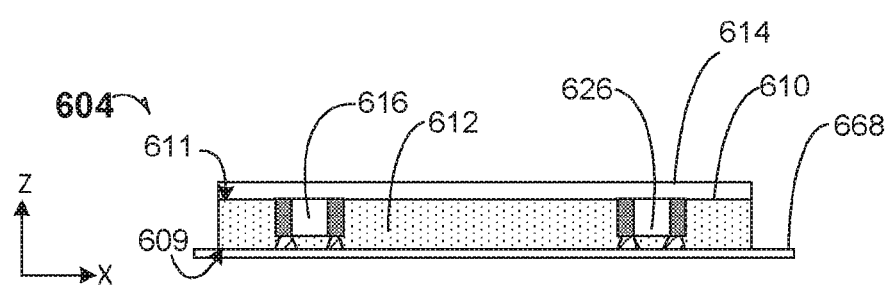

At FIG. 6D, the assembly 604 has been inverted and the first carrier 666 has been stripped from the die side 611. A second carrier 668 is assembled to the package side 609. A metal build-up layer 614 has been fabricated on the die side 611 such that the passive devices 616 and 626 are directly coupled to the metal build-up layer 614.

After achieving the assembly 604, it may be inserted into an IC package substrate as a die-side proximate insert.

It may now be appreciated that a given IC package substrate, such as the substrates 120, 220 and 520, may be held standard in design and design rules, while upgrading a generation of IC dice, e.g. the IC dice 10, 11, 11', 20 and 21, and simply changing out a given molded interconnects bridge, e.g. 110, 210, 310, 410 and 510, with complex or simple capacitor configurations that accommodate upgraded generations of die-side IC dice. Consequently, next-generation die-side dice may be deployed with the IC package substrates only needing upgraded molded interconnect bridges.

Figure 7:
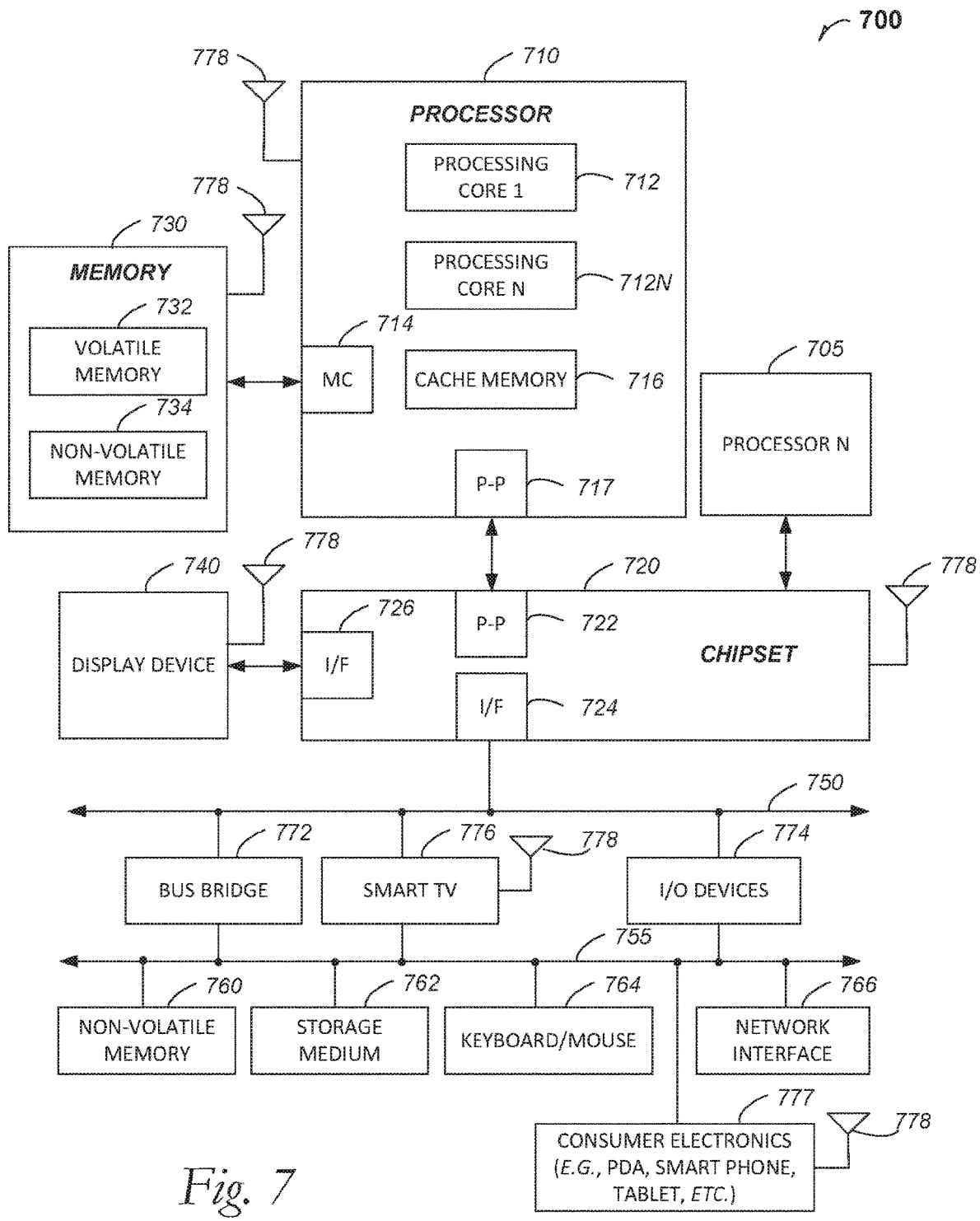
FIG. 7 is included to show an example of a higher-level device application for the disclosed embodiments.

FIG. 7 is included to show an example of a higher-level device application for the disclosed embodiments. The molded interconnects bridge embodiments may be found in several parts of a computing system. In an embodiment, the molded interconnects bridge embodiments can be part of a communications apparatus such as is affixed to a cellular communications tower. In an embodiment, a computing system 700 includes, but is not limited to, a desktop computer. In an embodiment, a computing system 700 includes, but is not limited to a laptop computer. In an embodiment, a computing system 700 includes, but is not limited to a tablet. In an embodiment, a computing system 700 includes, but is not limited to a notebook computer. In an embodiment, a computing system 700 includes, but is not limited to a personal digital assistant (PDA). In an embodiment, a computing system 700 includes, but is not limited to a server. In an embodiment, a computing system 700 includes, but is not limited to a workstation. In an embodiment, a computing system 700 includes, but is not limited to a cellular telephone. In an embodiment, a computing system 700 includes, but is not limited to a mobile computing device. In an embodiment, a computing system 700 includes, but is not limited to a smart phone. In an embodiment, a system 700 includes, but is not limited to an internet appliance. Other types of computing devices may be configured with the microelectronic device that includes molded interconnects bridge embodiments.

In an embodiment, the processor 710 has one or more processing cores 712 and 712N, where 712N represents the Nth processor core inside processor 710 where N is a positive integer. In an embodiment, the electronic device system 700 using a molded interconnects bridge embodiment that includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the molded interconnects bridge element on an integrated-circuit package substrate in the system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. In an embodiment, the chipset 720 is part of a molded interconnects bridge embodiment depicted, e.g. in FIGS. 1A, 1B and 5.

The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a molded interconnects bridge embodiment as set forth in this disclosure. The chipset 720 enables the processor 710 to connect to other elements in a molded interconnects bridge embodiment in a system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In an embodiment, the processor 710 and the chipset 720 are merged into a molded interconnects bridge embodiment in a system. Additionally, the chipset 720 connects to one or more buses 750 and 755 that interconnect various elements 774, 760, 762, 764, and 766. Buses 750 and 755 may be interconnected together via a bus bridge 772 such as at least one molded interconnects bridge embodiment. In an embodiment, the chipset 720, via interface 724, couples with a non-volatile memory 760, a mass storage device(s) 762, a keyboard/mouse 764, a network interface 766, smart TV 776, and the consumer electronics 777, etc.

In an embodiment, the mass storage device 762 includes, but is not limited to, a solid-state drive, a hard disk drive, a universal serial bus flash memory drive, or any other form of computer data storage medium. In one embodiment, the network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the molded interconnects bridge embodiments in a computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

To illustrate the molded interconnects bridge IC package embodiments and methods disclosed herein, a non-limiting list of examples is provided herein:

Example 1 is an integrated-circuit package apparatus, comprising: an integrated-circuit package substrate, including a die side and a land side; a molded interconnects bridge, including: a molding-mass frame, wherein the molding-mass frame has a die side and a package side, and wherein the molding-mass frame is embedded in the integrated-circuit (IC) package substrate, and wherein the molding-mass frame is closer to the IC package substrate die side than to the land side; a passive device in the molding-mass frame, wherein the passive device, occupies at least some of the same vertical space encompassed by the molding-mass frame; and a metal build-up layer on the molding-mass frame die side, wherein the metal build-up layer is closer to the IC package substrate die side than to the land side, wherein the metal build-up layer is coupled to the passive device, and wherein the metal build-up layer includes a conductive trace, a power (Vcc) rail and a ground (Vss) rail.

In Example 2, the subject matter of Example 1 optionally includes wherein the passive device is a first capacitor, further including: a subsequent capacitor in the molding-mass frame.

In Example 3, the subject flatter of any one or more of Examples 1-2 optionally include wherein the passive device is a first capacitor, further including: a subsequent capacitor in the molding-mass frame; wherein the metal build-up layer has a first power rail coupled to the first capacitor; and wherein the metal build-up layer includes a subsequent power rail coupled to the subsequent capacitor.

In Example 4, the subject matter of any one or more of Examples 1-3 optionally include wherein the metal build-up layer is coupled to the die side of the integrated-circuit package substrate, further including: a first integrated-circuit die on the IC package substrate die side, wherein the first integrated-circuit die is coupled to the passive device.

In Example 5, the subject matter of any one or more of Examples 1-4 optionally include wherein the metal build-up layer is coupled to the die side of the IC package substrate, wherein the passive device is a first capacitor, further including: a first integrated-circuit die on the IC package substrate die side, wherein the first integrated-circuit die is coupled to the passive device; a subsequent capacitor in the molding-mass frame; a first integrated-circuit die on the IC package substrate die side, wherein the first integrated circuit die is coupled to the first capacitor; and a subsequent integrated-circuit die on the IC package substrate die side, wherein the subsequent integrated circuit die is coupled to the subsequent capacitor.

In Example 6, the subject matter of Example 5 optionally includes wherein the first integrated circuit die is coupled to the subsequent integrated circuit die through the conductive trace.

In Example 7, the subject matter of any one or more of Examples 1-6 optionally include wherein the passive device is both coupled to the IC package substrate die side and to the land side.

In Example 8, the subject matter of any one or more of Examples 1-7 optionally include wherein the passive device is both coupled to the IC package substrate die side and to the land side; further including: a first IC die on the IC package substrate die side; a subsequent IC die on the IC package substrate die side; a third IC die in a memory-die stack on the IC package substrate die side; and a fourth IC die on the IC package substrate die side.

In Example 9, the subject matter of any one or more of Examples 1-8 optionally include wherein the molded interconnects bridge includes the passive device as a first capacitor, further including: a stacked subsequent capacitor on the first capacitor, wherein power electrodes of the first and stacked subsequent capacitors make contact and form a first power rail.

In Example 10, the subject matter of any one or more of Examples 1-9 optionally include wherein the molded interconnects bridge includes the passive device as a first capacitor, further including: a stacked subsequent capacitor on the first capacitor, wherein power electrodes of the first and stacked subsequent capacitors make contact and form a first power rail; and a third capacitor, wherein the stacked subsequent capacitor and the third capacitor make contact at ground electrodes to form a ground rail.

In Example 11, the subject matter of any one or more of Examples 1-10 optionally include wherein the molded interconnects bridge includes the passive device as a first capacitor, further including: a stacked subsequent capacitor on the first capacitor, wherein power electrodes of the first and stacked subsequent capacitors make contact and form a first power rail; a third capacitor, wherein the stacked subsequent capacitor and the third capacitor make contact at ground electrodes to form a ground rail; a stacked fourth capacitor on the third capacitor, wherein power electrodes of the stacked fourth capacitor and the third capacitor make contact to form a second power rail; and a fifth capacitor, wherein the stacked fourth capacitor and the fifth capacitor make contact at ground electrodes to form a ground rail.

In Example 12, the subject matter of any one or more of Examples 1-11 optionally include wherein the molded interconnects bridge includes the passive device as a first capacitor, further including: a stacked subsequent capacitor on the first capacitor, wherein power electrodes of the first and stacked subsequent capacitors make contact and form a first power rail; a third capacitor, wherein the stacked subsequent capacitor and the third capacitor make contact at ground electrodes to form a ground rail; a stacked fourth capacitor on the third capacitor, wherein power electrodes of the stacked forth capacitor and the third capacitor make contact to form a second power rail; a fifth capacitor, wherein the stacked fourth capacitor and the fifth capacitor make contact at ground electrodes to form a ground rail; a first IC die on the IC package substrate die side; a subsequent IC die on the IC package substrate die side; a third IC die in a memory-die stack on the IC package substrate die side; and a fourth IC die on the IC package substrate die side.

Example 13 is a method of assembling an integrated-circuit device package, comprising: assembling a first capacitor and a subsequent capacitor in a molding-mass frame; assembling a metal build-up layer on the molding-mass frame, wherein the metal build-up layer is coupled to the first capacitor and the subsequent capacitor, and wherein the metal build-up layer includes a conductive trace, a power (Vcc) rail and a ground (Vss) rail, to form a molded interconnects bridge; embedding the molded interconnects bridge in an integrated-circuit package substrate that has a die side and a land side, wherein the molded interconnects bridge is closer to the IC package substrate die side than to the land side; and assembling an integrated-circuit die to the IC package substrate die side, to couple the first capacitor to the integrated-circuit die.

In Example 14, the subject matter of Example 13 optionally includes wherein the integrated-circuit die is a first IC die, further including assembling a subsequent integrated-circuit die to the IC package substrate die side, to couple the subsequent capacitor to the subsequent integrated-circuit die.

In Example 15, the subject matter of Example 14 optionally includes coupling the first IC die to the subsequent integrated-circuit die through the conductive trace.

In Example 16, the subject matter of any one or more of Examples 13-15 optionally include wherein the integrated-circuit die is a first IC die, further including: assembling a subsequent integrated-circuit die to the IC package substrate die side, to couple the subsequent capacitor to the subsequent integrated-circuit die; and assembling the land side to a board.

In Example 17, the subject matter of any one or more of Examples 13-16 optionally include wherein the integrated-circuit die is a first IC die, further including: assembling a subsequent integrated-circuit die to the IC package substrate die side, to couple the subsequent capacitor to the subsequent integrated-circuit die; assembling a third integrated-circuit die to the IC package substrate die side; assembling a fourth integrated-circuit die to the IC package substrate die side; and assembling the land side to a board, wherein the first through fourth integrated-circuit dice are part of a processor.

In Example 18, the subject matter of any one or more of Examples 13-17 optionally include wherein the integrated-circuit die is a first IC die, wherein the first capacitor is part of a semi-serpentine string of five capacitors, and wherein two power rails are formed by power electrodes of the first capacitor and a stacked subsequent capacitor on the first capacitor in a stack as a first power rail, and by power electrodes of a third capacitor and a stacked fourth capacitor on the third capacitor in a stack as a second power rail, further including: coupling the first IC die to one of the first power rail; and coupling a subsequent IC die on the IC package substrate die side to the second power rail.

In Example 19, the subject matter of any one or more of Examples 13-18 optionally include wherein the integrated-circuit die is a first IC die, wherein the first capacitor is part of a semi-serpentine string of five capacitors, and wherein two power rails are formed by power electrodes of the first capacitor and a stacked subsequent capacitor on the first capacitor in a stack as a first power rail, and by power electrodes of a third capacitor and a stacked fourth capacitor on the third capacitor in a stack as a second power rail, further including: coupling the first IC die to the first power rail; coupling a subsequent IC die on the IC package substrate die side to the second power rail; assembling a third IC die in a memory die stack to the IC package substrate die side; assembling a fourth IC die to the IC package substrate die side; and assembling the IC package substrate to a printed wiring board.

Example 20 is a computing system comprising: a first integrated-circuit (IC) die on a die side of an integrated-circuit package substrate; a subsequent IC die on the die side of the IC package substrate; a molded interconnects bridge, including: a molding-mass frame, wherein the molding-mass frame has a die side and a package side, and wherein the molding-mass frame is embedded in the integrated-circuit (IC) package substrate, and wherein the molding-mass frame is closer to the IC package substrate die side than to the land side; a passive device in the molding-mass frame, wherein the passive device, occupies at least some of the same vertical space encompassed by the molding-mass frame; and a metal build-up layer on the molding-mass frame die side, wherein the metal build-up layer is closer to the IC package substrate die side than to the land side, wherein the metal build-up layer is coupled to the passive device, and wherein the metal build-up layer includes a conductive trace, a power (Vcc) rail and a ground (Vss) rail; wherein the IC package substrate is coupled to a printed wiring board at the land side; and wherein the molded interconnects bridge is part of a processor.

In Example 21, the subject matter of Example 20 optionally includes a third IC die on the IC package substrate die side, wherein the third IC die is a memory die in a memory-die stack that is interconnected by a through-silicon via; and a fourth IC die on the IC package substrate die side that is one of a graphic processing unit (CPU) and a platform controller hub.

In Example 22, the subject matter of any one or more of Examples 20-21 optionally include a baseband processor die on the IC package substrate die side.

In Example 23, the subject matter of Example 22 optionally includes wherein the printed wiring board includes an external shell that is a dielectric material, and wherein the external shell is at least part of the exterior of an apparatus selected from a mobile computing system and a drone.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. An apparatus, comprising:
a substrate including a die side and a land side; and
a molded interconnects bridge including:
 a molding-mass frame including a die side and a package side, wherein the molding-mass frame is embedded in the substrate, and wherein the molding-mass frame is closer to the die side of the substrate than to the land side of the substrate;
 a capacitor in the molding-mass frame, wherein the capacitor occupies at least some of the same vertical space encompassed by the molding-mass frame, the capacitor including a first conductive region, a second conductive region, and a dielectric region located between the first conductive region and the second conductive region; and
 a build-up layer on the die side of the molding-mass frame, wherein the build-up layer is closer to the die side of the substrate than to the land side of the substrate, wherein the build-up layer includes a first conductive trace electrically coupled to the first conductive region of the capacitor, and wherein the build-up layer further includes a second conductive trace electrically coupled to the second conductive region of the capacitor.

2. The apparatus of claim 1, wherein the capacitor is a first capacitor, the apparatus further including a second capacitor in the molding-mass frame, the second capacitor including a first conductive region, a second conductive region, and a dielectric region located between the first conductive region and the second conductive region.

3. The apparatus of claim 1, wherein the capacitor is a first capacitor, the apparatus further including a second capacitor in the molding-mass frame including a first conductive region, a second conductive region, and a dielectric region located between the first conductive region and the second conductive region, wherein the build-up layer further includes a third conductive trace electrically coupled to the first conductive region of the second capacitor.

4. The apparatus of claim 1, further including an integrated circuit die on the die side of the substrate, wherein the integrated circuit die is electrically coupled to the first conductive trace and the second conductive trace of the build-up layer.

5. The apparatus of claim 1, wherein the capacitor is a first capacitor, the apparatus further including:
 a first integrated circuit die on the die side of the substrate, wherein the first integrated circuit die is electrically coupled to the first conductive region of the first capacitor;
 a second capacitor in the molding-mass frame, the second capacitor including a first conductive region, a second conductive region, and a dielectric region located between the first conductive region and the second conductive region; and
 a second integrated circuit die on the die side of the substrate, wherein the second integrated circuit die is electrically coupled to the first conductive region of the second capacitor.

6. The apparatus of claim 5, wherein the build-up layer includes a third conductive trace, wherein the first integrated circuit die is electrically coupled to the second integrated circuit die via the third conductive trace.

7. The apparatus of claim 1, wherein the capacitor is electrically coupled to the die side of the substrate and to the land side of the substrate.

8. The apparatus of claim 1, wherein the capacitor is electrically coupled to the die side of the substrate and to the land side of the substrate, the apparatus further including:
 a first integrated circuit die on the die side of the substrate;
 a second integrated circuit die on the die side of the substrate;
 a third integrated circuit die on the die side of the substrate, wherein the third integrated circuit die is a memory die of a plurality of memory dice arranged in a stack; and
 a fourth integrated circuit die on the die side of the substrate.

9. The apparatus of claim 1, wherein the capacitor is a first capacitor, the apparatus further including subsequent second capacitor stacked on the first capacitor, wherein the second capacitor includes a first conductive region, a second conductive region, and a dielectric region located between the first conductive region and the second conductive region, wherein the first conductive region of the first capacitor contacts the first conductive region of the second capacitor.

10. The apparatus of claim 1, wherein the capacitor is a first capacitor, the apparatus further including:
 a second capacitor stacked on the first capacitor, wherein the second capacitor includes a first conductive region, a second conductive region, and a dielectric region located between the first conductive region and the second conductive region, wherein the first conductive region of the first capacitor contacts the first conductive region of the second capacitor; and
 a third capacitor including a first conductive region, a second conductive region, and a dielectric region located between the first conductive region and the second conductive region, wherein the second conductive region of the second capacitor contacts the first conductive region of the third capacitor.

11. The apparatus of claim 1, wherein the capacitor is a first capacitor, the apparatus further including:
 a second capacitor stacked on the first capacitor, the second capacitor includes a first conductive region, a second conductive region, and a dielectric region located between the first conductive region and the second conductive region, wherein the first conductive region of the first capacitor contacts the first conductive region of the second capacitor;
 a third capacitor including a first conductive region, a second conductive region, and a dielectric region located between the first conductive region and the second conductive region, wherein the second conductive region of the second capacitor contacts the first conductive region of the third capacitor;
 a fourth capacitor stacked on the third capacitor, wherein the fourth capacitor includes a first conductive region, a second conductive region, and a dielectric region located between the first conductive region and the second conductive region, wherein the second conductive region of the third capacitor contacts the first conductive region of the fourth capacitor; and
 a fifth capacitor including a first conductive region, a second conductive region, and a dielectric region located between the first conductive region and the second conductive region, wherein the second conductive region of the fourth capacitor contacts the first conductive region of the fifth capacitor.

12. The apparatus of claim 11, further including:
 a first integrated circuit die on the die side of the substrate;
 a second integrated circuit die on the die side of the substrate;
 a third integrated circuit die on the die side of the substrate, wherein the third integrated circuit die is a memory die of a plurality of memory dice arranged in a stack; and
 a fourth integrated circuit die on the die side of the substrate.

13. A computing system comprising:
 a substrate including a die side and a land side;
 a first integrated circuit die on the die side of the substrate;
 a second integrated circuit die on the die side of the substrate;
 a molded interconnects bridge including:
  a molding-mass frame including a die side and a package side, wherein the molding-mass frame is embedded in the substrate, and wherein the molding-mass frame is closer to the die side of the substrate than to the land side of the substrate;
  a capacitor in the molding-mass frame, wherein the capacitor occupies at least some of the same vertical space encompassed by the molding-mass frame, the capacitor including a first conductive region, a second conductive region, and a dielectric region located between the first conductive region and the second conductive region; and a build-up layer on the die side of the molding-mass frame, wherein the build-up layer is closer to the die side of the substrate than to the land side of the substrate, wherein the build-up layer includes a first conductive trace electrically coupled to the first conductive region of the capacitor, and wherein the build-up layer further includes a second conductive trace electrically coupled to the second conductive region of the capacitor; and a printed wiring board, wherein the substrate is coupled to the printed wiring board at the land side of the substrate.

14. The computing system of claim 13, further including:
a third integrated circuit die on the die side of the substrate, wherein the third integrated circuit die is a memory die of a plurality of memory dice arranged in a stack; and
a fourth integrated circuit die on the die side of the substrate.

15. The computing system of claim 13, wherein the first integrated circuit die is part of or is a central processing unit.

16. The computing system of claim 15, further comprising an antenna, wherein the first integrated circuit die is electrically coupled to the antenna.

17. An apparatus, comprising:
a substrate including a top side and a bottom side;
a molding-mass frame including a top side and a bottom side, wherein the molding-mass frame is embedded in the substrate and the molding-mass frame is closer to the top side of the substrate than to the bottom side of the substrate;
a capacitor in the molding-mass frame, the capacitor including a first conductive region, a second conductive region, and a dielectric region located between the first conductive region and the second conductive region; and
a redistribution layer on the top side of the molding-mass frame, wherein the redistribution layer includes a first conductive trace electrically coupled to the first conductive region of the capacitor and a second conductive trace electrically coupled to the second conductive region of the capacitor.

18. The apparatus of claim 17, wherein the capacitor is a first capacitor, the apparatus further including a second capacitor in the molding-mass frame, wherein the second capacitor includes a first conductive region, a second conductive region, and a dielectric region located between the first conductive region and the second conductive region.

19. The apparatus of claim 17, wherein the capacitor is a first capacitor, the apparatus further including a second capacitor in the molding-mass frame, wherein the second capacitor includes a first conductive region, a second conductive region, and a dielectric region located between the first conductive region and the second conductive region, wherein the redistribution layer further includes a third conductive trace electrically coupled to the first conductive region of the second capacitor.

20. The apparatus of claim 17, further including an integrated circuit die on the top side of the substrate, wherein the integrated circuit die is electrically coupled to the first conductive trace of the redistribution layer and the second conductive trace of the redistribution layer.

21. The apparatus of claim 17, wherein the capacitor is a first capacitor, the apparatus further including:
a first integrated circuit die on the top side of the substrate, wherein the first integrated circuit die is electrically coupled to the first conductive region of the first capacitor;
a second capacitor in the molding-mass frame, the second capacitor including a first conductive region, a second conductive region, and a dielectric region located between the first conductive region and the second conductive region; and
a second integrated circuit die on the top side of the substrate, wherein the second integrated circuit die is electrically coupled to the first conductive region of the second capacitor.

22. The apparatus of claim 17, wherein the capacitor is electrically coupled to the top side of the substrate and to the bottom side of the substrate.

23. The apparatus of claim 21, wherein the redistribution layer includes a third conductive trace, wherein the first integrated circuit die is electrically coupled to the second integrated circuit die via the third conductive trace.

* * * * *